(12) United States Patent
Ozawa et al.

(10) Patent No.: US 6,316,838 B1
(45) Date of Patent: Nov. 13, 2001

(54) SEMICONDUCTOR DEVICE

(75) Inventors: Kaname Ozawa, Kawasaki; Hayato Okuda, Aizuwakamatsu; Tetsuya Hiraoka; Mitsutaka Sato, both of Kawasaki; Yuji Akashi, Kasugai; Akira Okada; Masahiko Harayama, both of Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/531,231

(22) Filed: Mar. 20, 2000

(30) Foreign Application Priority Data

Oct. 29, 1999 (JP) .................................................. 11-310150

(51) Int. Cl.[7] .......................... H01L 23/48; H01L 23/52; H01L 29/40
(52) U.S. Cl. .......................... 257/778; 257/777; 257/686
(58) Field of Search ................................... 257/686, 777, 257/782, 783, 666, 723, 724

(56) References Cited

U.S. PATENT DOCUMENTS 5,495,398 * 2/1996 Takiar et al. .
6,100,594 * 8/2000 Fukui et al. .
6,104,084 * 8/2000 Ishio et al. .
6,118,176 * 9/2000 Tao et al. .
6,118,184 * 9/2000 Ishio et al. .
6,181,002 * 1/2001 Juso et al. .

* cited by examiner

*Primary Examiner*—Sheila V. Clark
(74) *Attorney, Agent, or Firm*—Armstrong, Westerman, Hattori, McLeland & Naughton, LLP

(57) ABSTRACT

A semiconductor device includes a substrate provided with a plurality of leads, a face-down semiconductor element provided on one surface of the substrate, a first stacked semiconductor element and a second stacked semiconductor element provided on another surface of the substrate and connected to the substrate by wires, and an extended wiring mechanism for connecting electrodes of the face-down semiconductor element and electrodes of the first and second semiconductor elements. The connected electrodes are equi-electrodes whose electrical characteristics are equal.

8 Claims, 17 Drawing Sheets

SEMICONDUCTOR DEVICE

BACKGROUND OF THE INVENTION

1. Field of the Invention

The present invention generally relates to semiconductor devices and methods for producing the same, and more particularly to a semiconductor device and a method for producing the semiconductor device, which is configured to have a plurality of semiconductor elements stacked therein.

In recent years, with increasing demand for miniaturized portable equipment such as a portable telephone, a semiconductor device that is installed therein has also been required to have a smaller size. In order to support this situation, a stack-type semiconductor device, which has a plurality of semiconductor elements stacked within resin for encapsulation (a package) thereof, is developed.

2. Description of the Related Art

FIG. 1 shows a conventional stack-type semiconductor device 1, comprising a plurality of semiconductor elements 2, 3 (two in this diagram) which are carried by a stage portion 5a of a plurality of leads 5.

Specifically, the semiconductor element 2 is installed under the stage portion 5a and the semiconductor element 3 is installed on the stage portion 5a, each with adhesive 12 and in a face-up state. Accordingly, electrodes 7 provided on the semiconductor element 2 and electrodes 8 provided on the semiconductor element 3 face away from the stage portion 5a.

The electrodes 7 and 8 are connected to bonding pads 5c of the leads 5 by wires 10 and 11, respectively. Also, outer leads 5b of the leads 5 are formed extending out of encapsulating resin 6, for example, like a gull wing.

Thus, by installing the plurality of semiconductor elements within the encapsulating resin 6, the semiconductor device 1 can be produced with a smaller size and lighter weight, compared to a semiconductor device where the semiconductor elements are separately packaged.

In the semiconductor device 1 where the plurality of semiconductor elements are installed, however, in a case where a plurality of wires are simultaneously bonded to one bonding pad 5c to connect electrodes, electrical characteristics and signal characteristics of the electrodes need to be equal. That is, the electrodes to be connected by the wires should be equi-electrodes.

As shown in FIG. 1, if the semiconductor element 2 and the semiconductor element 3 are the same type semiconductor elements just different in size, then the electrodes 7 and 8 of the semiconductor elements 2 and 3 are the same in electrode layout. Accordingly, in a case where the semiconductor element 2 is directly stacked on the semiconductor element 3, two up-and-down adjacent electrodes 7 and 8 become equi-electrodes, and therefore can be connected by a wire running up and down.

In the conventional semiconductor device 1, however, the leads 5 (the stage portion 5a) are interposed between the semiconductor elements 2 and 3 as shown in FIG. 1. According to this configuration, the electrodes 7 of the semiconductor element 2 and the electrodes 8 of the semiconductor element 3 are symmetrical with respect to the stage portion 5a, respectively. That is, the electrodes 7 have a mirror relationship with the electrodes 8, respectively. But two electrodes 7 and 8 that have the mirror relationship are not equi-electrodes even if the semiconductor elements 2 and 3 are the same type semiconductor elements because those equi-electrodes 7 and 8 are separated in a diagonal, not an up-and-down, relationship. Therefore, in the conventional semiconductor device 1, the wire cannot be directly connected between the two up-and-down electrodes 7 and 8.

Accordingly, in a case of wiring those equi-electrodes 7 and 8 that are thus separated, the wires 10 and 11 need to be each laid with a large angle, and thereby a problem is brought about that the wiring becomes troublesome and easy to generate a short circuit due to contact of the wires.

In order to make the up-and-down electrodes 7 and 8 be equi-electrodes available connection, in a case where the semiconductor element 2 is different from the semiconductor element 3 in structure and the semiconductor element 2 is set as a standard, the semiconductor element 3 needs to be re-designed and re-produced so that the electrode layout thereof can have the mirror relationship with that of the semiconductor element 2. This brings about a cost increase in producing the semiconductor device 1.

SUMMARY OF THE INVENTION

It is a general object of the present invention to provide a semiconductor device, in which the above problems are eliminated.

Another and a more specific object of the present invention is to provide a semiconductor device, comprising:

a substrate;

a plurality of connecting terminals provided on said substrate;

a first semiconductor element provided on a first surface of said substrate in a face-down state;

a second semiconductor element provided on a second surface, opposite to said first surface, of said substrate and connected to said substrate by wires; and an extended wiring mechanism formed on said substrate for connecting electrodes of said first semiconductor element and electrodes of said second semiconductor element, said connected electrodes being equi-electrodes whose electrical characteristics are equal.

Other objects, features and advantages of the present invention will become more apparent from the following detailed description when read in conjunction with the accompanying drawings.

DETAILED DESCRIPTION OF THE PREFERRED EMBODIMENTS

With reference to the drawings, a description will be given below of preferred embodiments of the present invention.

Figure 1:
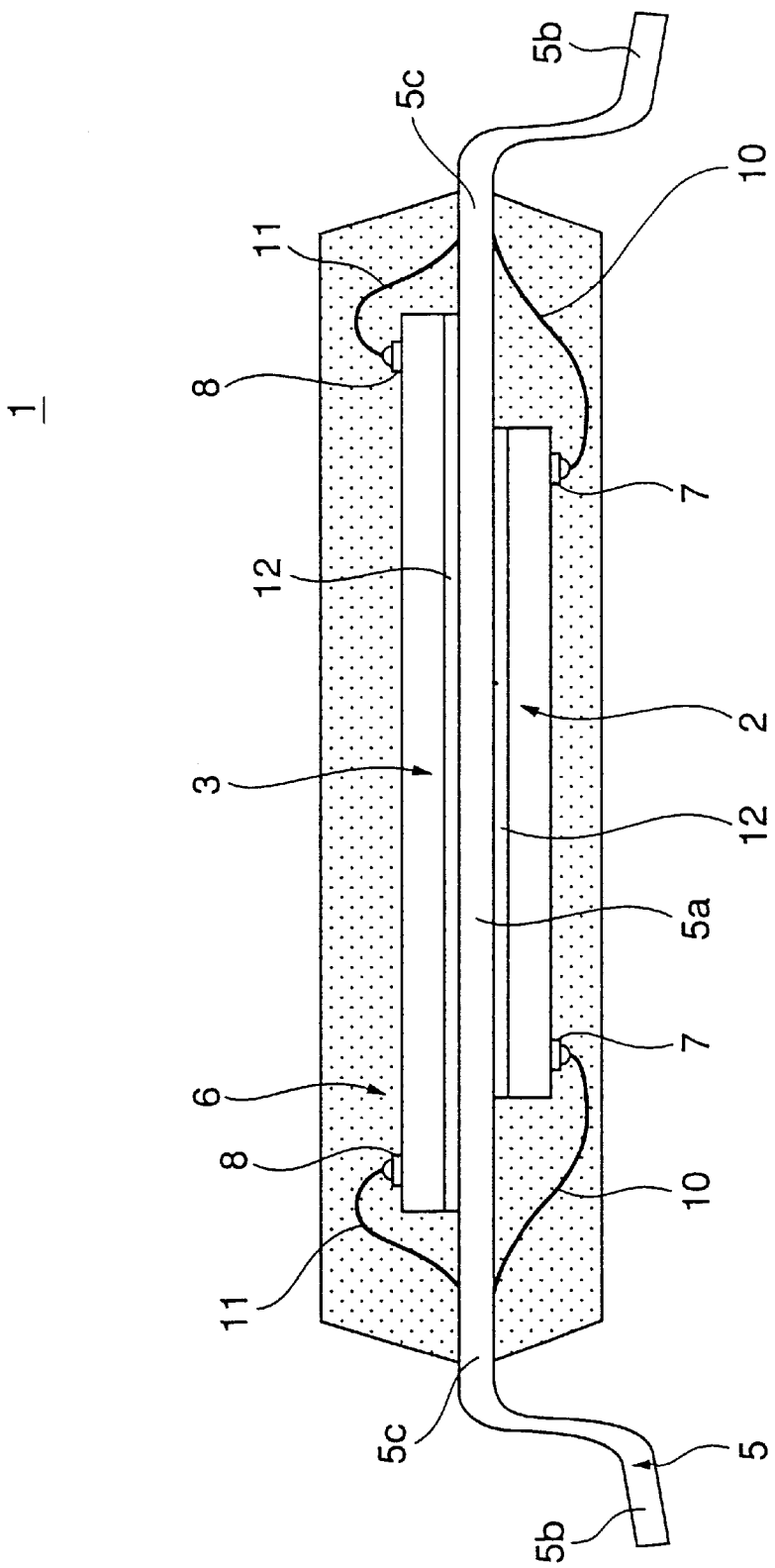
FIG. 1 is a cross-sectional view of a conventional semiconductor device.
Figure 2:
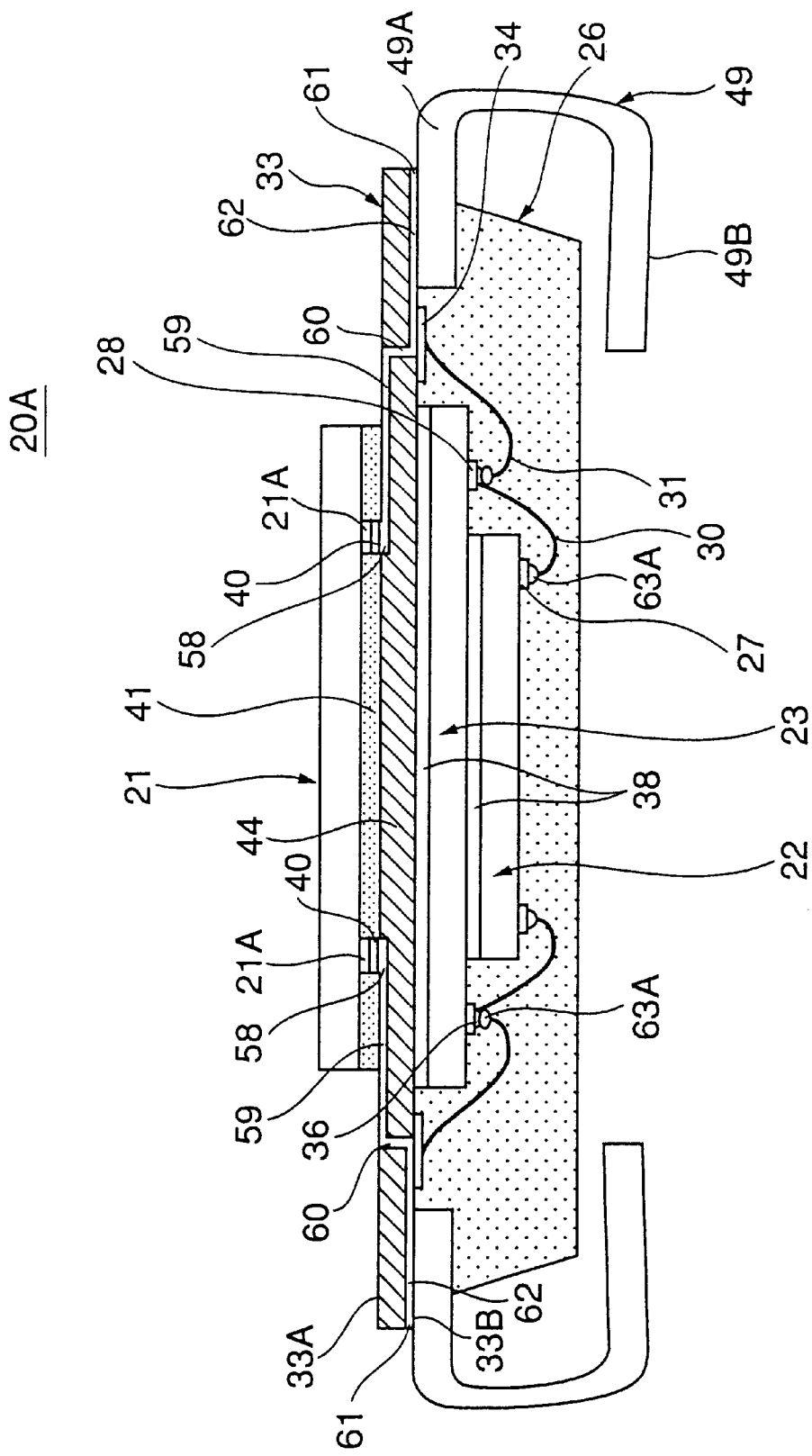
FIG. 2 is a cross-sectional view of a semiconductor device of a first embodiment according to the present invention.
Figure 3:
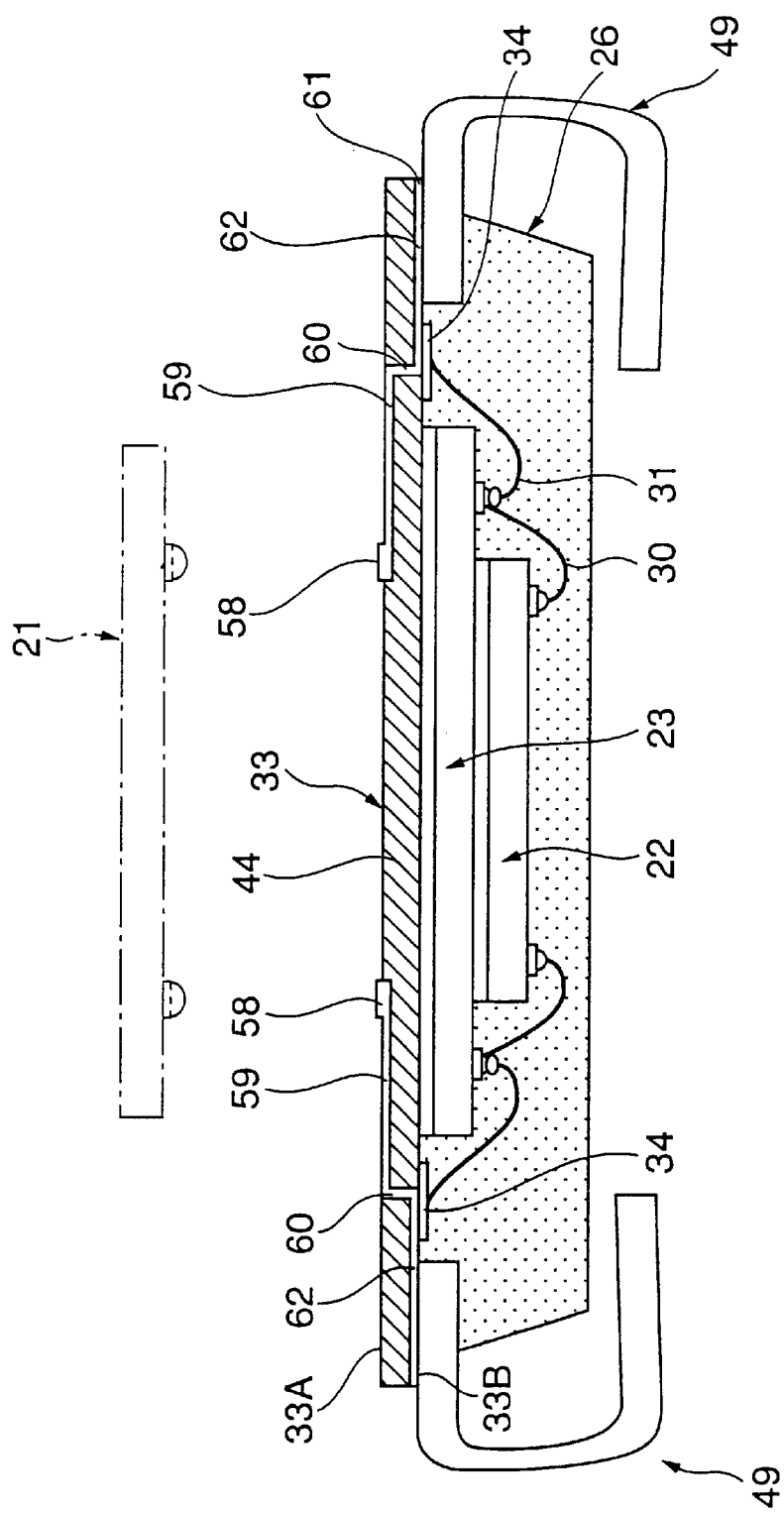
FIG. 3 shows a semiconductor device of the first embodiment in a state of a face-down semiconductor element being removed therefrom.
Figure 4:
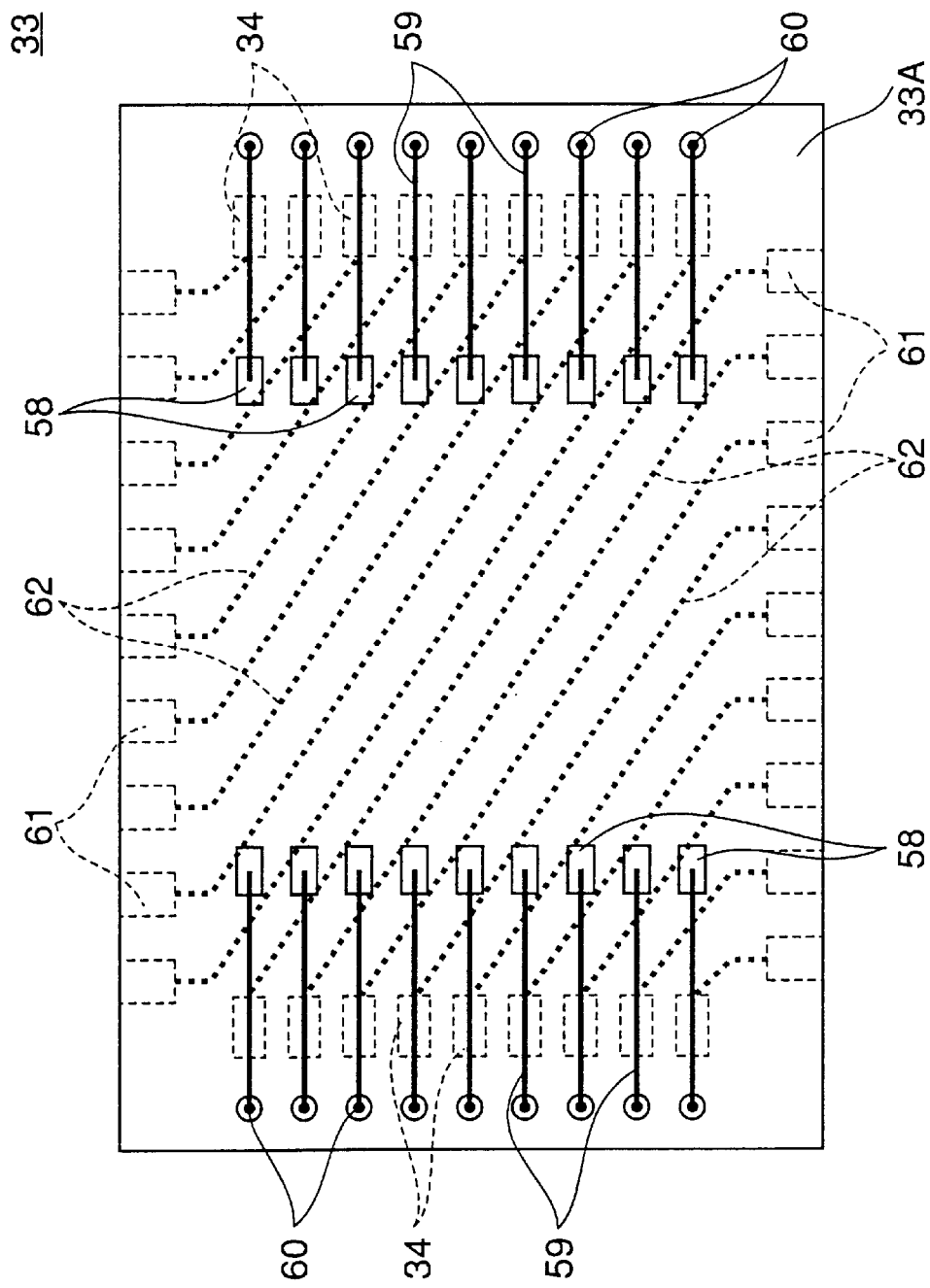
FIG. 4 shows a front surface of a substrate used by the semiconductor device of the first embodiment according to the present invention.
Figure 5:
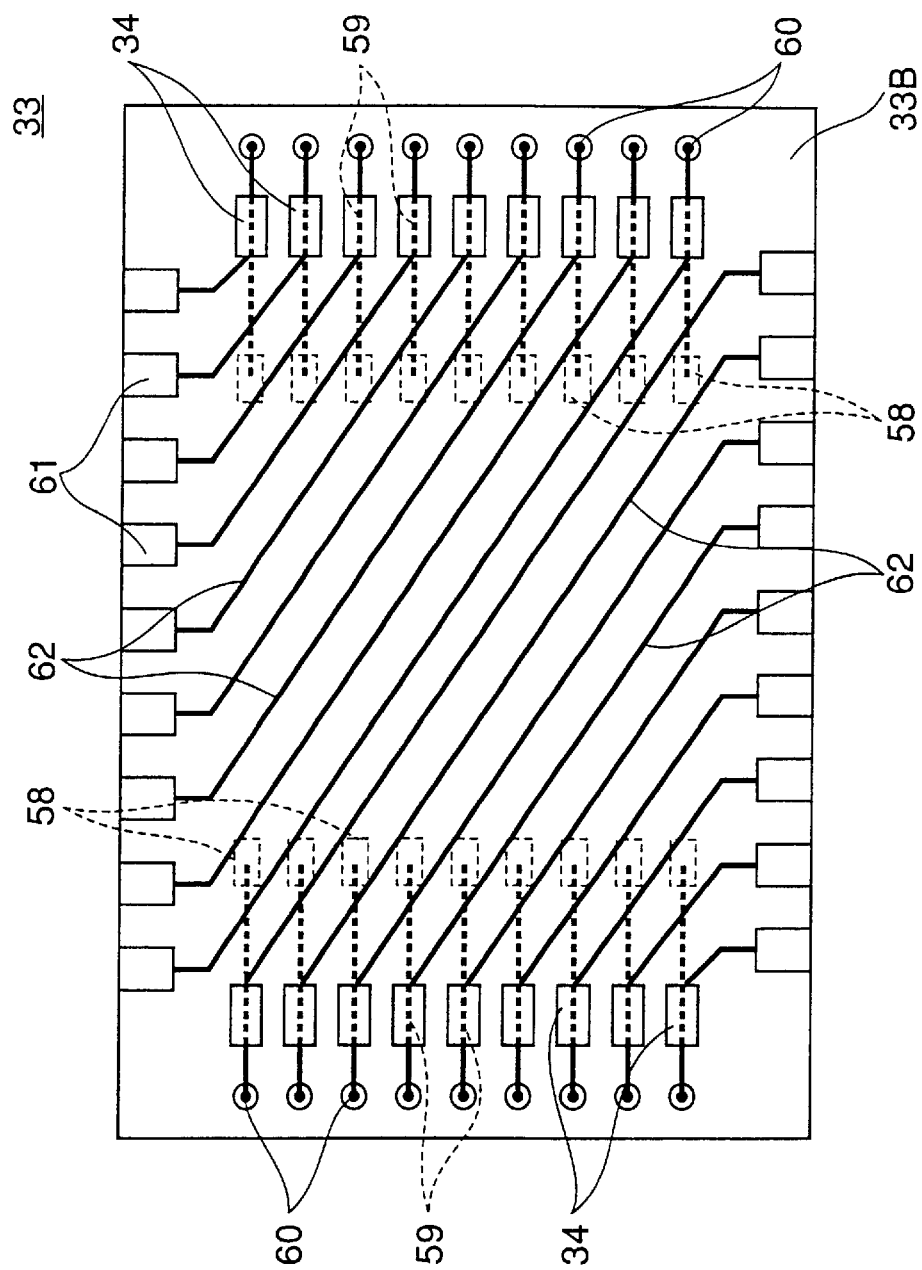
FIG. 5 shows a back surface of the substrate used by the semiconductor device of the first embodiment according to the present invention.

FIGS. 2 through 5 are diagrams for illustrating a semiconductor device 20A of a first embodiment according to the present invention. FIG. 2 is a cross-sectional view showing the semiconductor device 20A. FIG. 3 is a cross-sectional view showing the semiconductor device 20A in a state of a face-down semiconductor element 21 being removed therefrom. FIG. 4 shows a front surface 33A of a substrate 33 used in the semiconductor device 20A. FIG. 5 shows a back surface 33B of the substrate 33 used in the semiconductor device 20A.

The semiconductor device 20A of the present invention comprises a plurality of semiconductor elements 21 through 23 (three in this embodiment), encapsulating resin 26, a first and second wires 30 and 31, a substrate 33, and a plurality of leads 49 serving as connecting terminals.

The first, second and third semiconductor elements 21, 22 and 23 have respective different electrode layouts. Specifically, the semiconductor element 21 is provided on the front surface 33A of the substrate 33, and the semiconductor elements 22 and 23 are stacked on the back surface 33B of the substrate 33.

As shown in FIG. 2, the semiconductor element 21 is bonded in a face-down state on the front surface 33A of the substrate 33. The semiconductor element 21 has a plurality of electrodes 21A, to which a plurality of solder bumps 40 are joined, respectively. Also, a plurality of flip-chip pads (hereinafter referred to as F/C pads) 58 are formed on the front surface 33A of the substrate in positions corresponding to the respective electrodes 21A.

In this configuration, after the solder bumps 40 and the F/C pads 58 are thus installed, the semiconductor element 21, while being heated, is applied to the substrate 33 so that the solder bumps 40 are joined to the respective F/C pads 58. Thus, the semiconductor element 21 is bonded in a face-down state (flip-chip bonding) on the substrate 33. After that, underfill resin 41 is introduced between the semiconductor element 21 and the substrate 33 so as to reduce stress applied to the solder bumps 40.

Accordingly, the configuration of bonding the semiconductor element 21 in a face-down state on the substrate 33, can reduce the height of the semiconductor element 21 with respect to the substrate, compared to a configuration of performing wiring bonding. Further, since there is no wire used in the configuration, there is no need to form the encapsulating resin and thereby the semiconductor device 20A can be made thinner. In addition, the semiconductor element 21 may be encapsulated by resin if the resin does not affect the height of the semiconductor device 20A.

The semiconductor element 22 and the semiconductor element 23 are stacked on the back surface 33B of the substrate 33. Specifically, between the semiconductor element 22 and the semiconductor element 23 and between the semiconductor element 23 and the substrate 33, filmy insulation adhesives 38 are interposed, respectively. The semiconductor elements 22 and 23 and the substrate 33 are thus configured to adhere to each other by the insulation adhesives 38. In this embodiment, since the insulation adhesives 38 are filmy adhesives, they can be made uniform and very thin and contribute to thinness of the semiconductor 20A.

Also, in a state of being stacked together, the semiconductor elements 22 and 23 are configured such that at least one peripheral side of each of the semiconductor elements 22 and 23 is stepped so that they are stacked like stairs. As shown in FIG. 2, first and second electrodes 27 and 28 are provided in predetermined positions on peripheries of the semiconductor elements 22 and 23, respectively. Accordingly, the second electrodes 28 provided on the semiconductor element 23 are positioned on a stepped portion formed by the semiconductor element 22 and the semiconductor element 23.

The encapsulating resin 26 may be, for example, epoxy resin and is designed to be able to encapsulate the semiconductor elements 22 and 23 and the wires 30 and 31 therewithin.

The wires 30 and 31 may be fine conductive lines made of a metal material such as gold, aluminum, copper or the like, and be laid by using a wire bonding device. The first wires 30 are laid between the second electrodes 28 provided on the semiconductor element 23 and the first electrodes 27 provided on the semiconductor element 22 which is directly stacked on the semiconductor element 23. Also, the wires 30 and 31 are laid between electrodes which have identical electrical characteristics and signal characteristics, namely, equi-electrodes.

The second wires 31 are laid between wire bonding pads (hereinafter referred to as W/B pads) 34 provided on the substrate 33 and the second electrodes 28 provided on the semiconductor element 23 which is directly stacked on the substrate 33. In addition the meaning of " . . . directly stacked on . . . " is that " . . . stacked immediately on an upper portion of . . . ". But this does not mean that the insulation adhesive 38 is not interposed therebetween. Accordingly, for example, a semiconductor element, which is directly stacked on the substrate 33, is semiconductor element 23, not including the semiconductor element 22.

When laid as previously described, the first and second wires 30 and 31 are thus laid step by step from the outermost semiconductor element 22 to the substrate 33 as shown in FIGS. 2 and 3.

In this embodiment, since the first and second wires 30 and 31 are connected to the substrate 33 via the relay of the stacked semiconductor element 23, the length of each of the wires 30 and 31 can be shortened and thereby heights of wire loops thereof (distances from positions of second bonding of the wires to tops of the wire loops) can also be lowered.

Accordingly, space for the wire loops within the semiconductor device 20A can be designed smaller, and thereby the miniaturization (in height) of the semiconductor device 20A can be achieved. Also, in the embodiment, since only one of the wires 32 is coupled to a corresponding one of the W/B pads 34 provided on the substrate 33, the W/B pads 34 can be made smaller and thereby the semiconductor device 20A of the present invention can be downsized.

Next, a description is given below with respect to the substrate 33.

The substrate 33 may be, for example, a flexible wiring substrate made of polyimide as a basic material 44, or a printed wiring substrate made of glass epoxy as the basic material 44. The substrate 33 is provided with the plurality of W/B pads 34, the plurality of F/C pads 58, first extended wires 59, vias 60, lead connecting pads (hereinafter referred to as L/C pads) 61 and second extended wires 62.

As shown in FIG. 4, on the front surface 33A of the substrate 33, the F/C pads 58 and the first extended wires 59 are provided. The F/C pads 58, as previously described, are formed corresponding to the electrodes 21A of the semiconductor element 21 so that the semiconductor element 21 can be mounted in a face-down state by bonding the electrodes 21A to the respective F/C pads 58.

The first extended wires 59 are formed by print-wiring metal leaf, for example, copper leaf, formed into a predetermined pattern, each having one end coupled to its corresponding one of the F/C pads 58 and the other end coupled to its corresponding one of the vias 60. Also, the vias 60, which are formed penetrating the substrate 33, have respective through-holes into which metal conductive wires are inserted. The metal conductive wires serve to electrically connect the front surface 33A and the back surface 33B of the substrate 33.

As shown in FIG. 5, on the back surface 33B of the substrate 33, the W/B pads 34, L/C pads 61, and the second extended wires 62 are formed. One end of each of the second wires 31 is bonded to a corresponding one of the W/B pads 34, the other end being coupled to a corresponding one of the second electrodes 28 of the semiconductor element 23 as previously described.

The leads 49 as the connecting terminals are joined to the L/C pads 61, respectively. Since the leads 49 serve as the connecting terminals in this embodiment, the semiconductor device 20A can be a conventional lead-frame type semiconductor device. In addition, although the leads 49 are provided on the back surface 33B of the substrate 33 in this embodiment, the L/C pads 61 and the leads 49 may both be provided on the front surface 33A of the substrate 33.

The second extended wires 62 are also formed by print-wiring metal leaf, for example, the copper leaf, formed into a predetermined pattern. The forming of the first and second extended wires 59, 62 may be performed together. One end of each of the second extended wires 62 is coupled to a corresponding one of the L/C pads 61, the other end thereof being coupled to a corresponding one of the vias 60. Further, on each of the second extended wires 62 of connecting the vias 60 and the L/C pads 61, one of the W/B pads 34 is provided. Accordingly, the W/B pads 34, the L/C pads 61 and the vias 60 are electrically connected over the second extended wires 62.

As previously described, the vias 60 are formed penetrating the substrate 33, through which the first and second extended wires 59 and 62 are electrically connected, respectively. The F/C pads 58 to which the semiconductor element 21 is bonded in a face-down state, and the W/B pads 34 to which the semiconductor elements 22 and 23 are connected, are electrically connected by the first and second extended wires 59 and 62 and the vias 60. Accordingly, the electrodes 21A of the semiconductor element 21 and the electrodes 27 and 28 of the semiconductor elements 22 and 23 are electrically connected, and at the same time are connected to the leads 49 serving as the connecting terminals.

Thus, in a case of using wires to connect the electrodes 21A, 27 and 28 of the semiconductor elements 21 through 23, as previously described, each of the wires should be laid between two equi-electrodes whose electrical and signal characteristics are equal. In this embodiment, since the electrode layout of the semiconductor element 21 is different from those of the semiconductor elements 22 and 23, two up-and-down electrodes cannot be connected just through the via 60 formed on the substrate 33.

In this embodiment, however, since the first and second extended wires 59 and 62 are provided on the front and back surfaces 33A and 33B of the substrate 33, by using these extended wires 59 and 62, the equi-electrodes which are separated from each other can be connected.

According to this configuration, regardless of the layout of the semiconductor elements 21 through 23 and without requiring large loops in the wires 30 and 31, the equi-electrodes can be effectively connected. Further, since the wires 30 and 31 can avoid forming the large loops, they can be prevented from crossing and causing a short circuit. As a result, the wiring bonding process can be performed easily.

Also, according to the configuration of the present invention, since the equi-electrodes can be connected without considering the layouts of the semiconductor elements 21 through 23, the semiconductor elements 21 through 23 can be freely selected. Thus, there is no need to redesign the semiconductor elements to be installed so as to make layouts thereof identical. As a result, cost reduction in producing the semiconductor device 20A can be realized.

Also, since the extended wires 59 and 62 and the vias 60 can be formed on a conventional substrate, the substrate 33 provided with the same can be easily and cheaply produced.

In addition, as shown in FIG. 3, the face-down semiconductor element 21 can be shipped separately, and this can give clients an option to attach it to or detach it from the semiconductor device 20A as necessary.

Next, a description is given below with respect to a second embodiment of the present invention.

Figure 6:
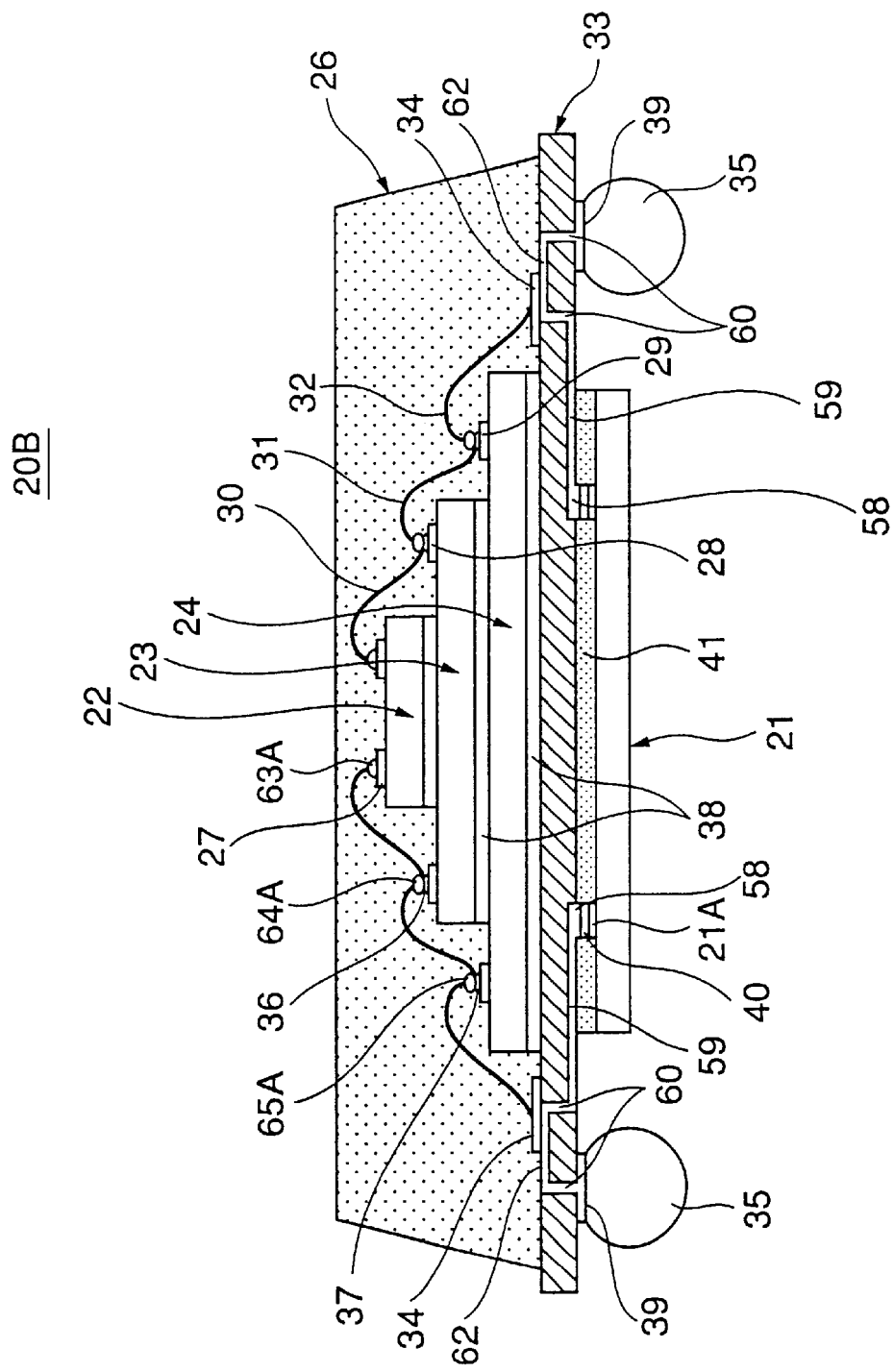
FIG. 6 is a cross-sectional view of a semiconductor device of a second embodiment according to the present invention.
Figure 7:
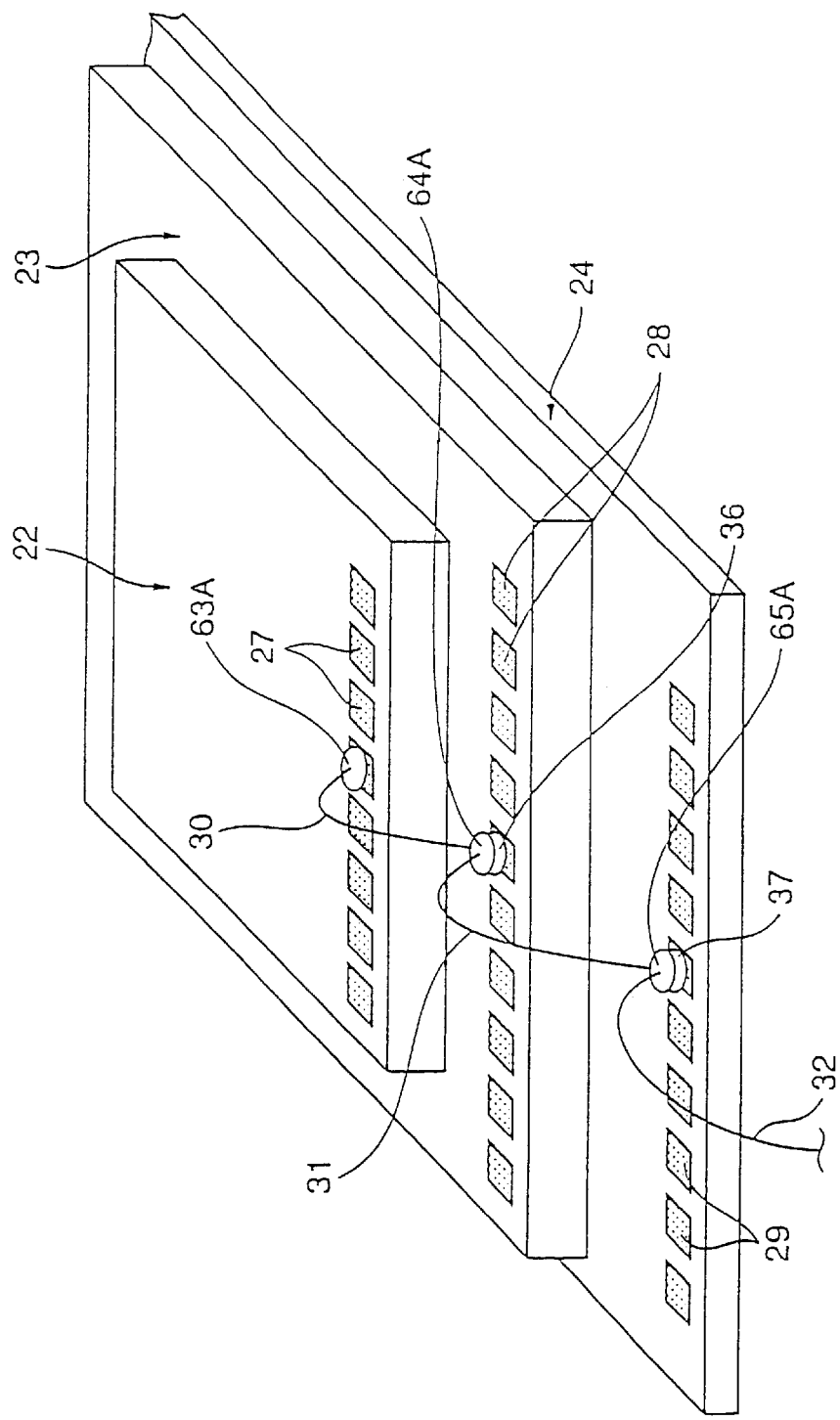
FIG. 7 is a diagram illustrating a wire connecting structure of the semiconductor device of the second embodiment according to the present invention.

FIG. 6 shows a semiconductor device 20B of the second embodiment. In FIG. 6, parts that are the same as those of the semiconductor device 20A of the first embodiment are given the same reference numerals and a description thereof is omitted.

Unlike the first embodiment where the semiconductor device 20A is provided with the leads 49 serving as the connecting terminals, the semiconductor device 20B of the second embodiment is provided with solder balls 35 serving as the connecting terminals. Also, on the substrate 33, ball-joining pads 39 are provided instead of the L/C pads 61. The ball-joining pads 39 are electrically connected to the first extended wires 59 laid on the substrate 33, respectively.

Also, unlike the first embodiment where the semiconductor device 20A comprises the two stacked semiconductor elements 22 and 23 which are provided on the substrate 33, in the second embodiment, the number of the semiconductor elements may not be limited to two and can be freely installed as necessary.

In the second embodiment, the semiconductor device 20B comprises three stacked semiconductor elements 22 through 24, the first through third electrodes 27 through 29 formed on the respective semiconductor elements 22 through 24, and the first through third wires 30 through 32 used for connecting the first through third electrodes 27 through 29.

Next, a description is given below of a method for producing the semiconductor device 20B previously described.

In addition, since the novel method of this embodiment is featured in a wire bonding process which serves to lay the first, the second and the third wires 30 through 32, and other methods are the same as conventional ones in other processes, a description of only the wire bonding process is given below.

FIGS. 8 through 12 are diagrams illustrating a sequence of the wire bonding process for laying the first, the second and the third wires 30 through 32.

Figure 8:
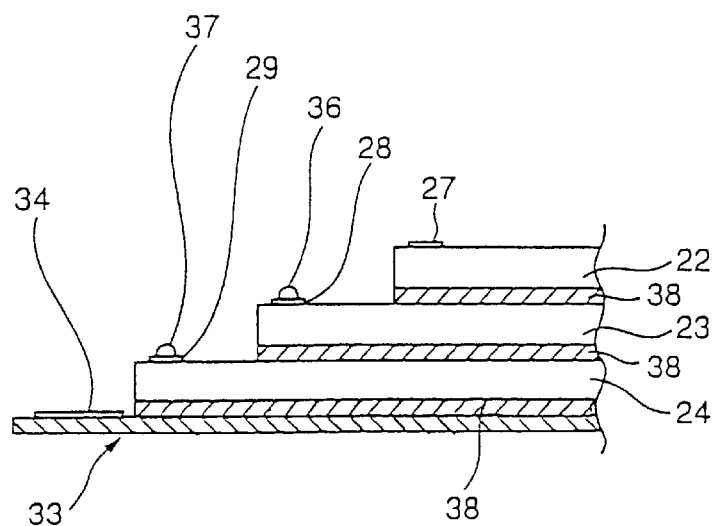
FIG. 8 is a diagram illustrating a bonding process in a method for producing the semiconductor device of FIG. 6.

FIG. 8 shows a state prior to the wiring bonding process of the wires 30 through 32. As shown in this diagram, the first to the third semiconductor elements 22 through 24 are stacked in advance on the substrate 33.

In this embodiment, a stud-bump forming process is performed for the wires 30 through 32 prior to the wire bonding process.

In the stud-bump forming process, first stud bumps 36 are formed on the second electrodes 28 provided on the second semiconductor element 23, and at the same time second stud bumps 37 are formed on the third electrodes 29 provided on the third semiconductor element 24. In this embodiment, stud bumps are not provided on the first electrodes 27.

The first and the second stud bumps 36 and 37, as will be described later, serve as spacer members, and are formed by using the wire bonding device also used for wire-bonding the first through the third wires 30 through 32. In addition, the stud bumps 36 and 37 may be made of a material the same as that of the wires 30 through 32.

Thus, one wire bonding device can lay both the stud bumps 36, 37 and wires 30 through 32. Accordingly, there is no need to use additional equipment to form the stud bumps 36 and 37 and thereby the cost thereof can be reduced.

Figure 9:
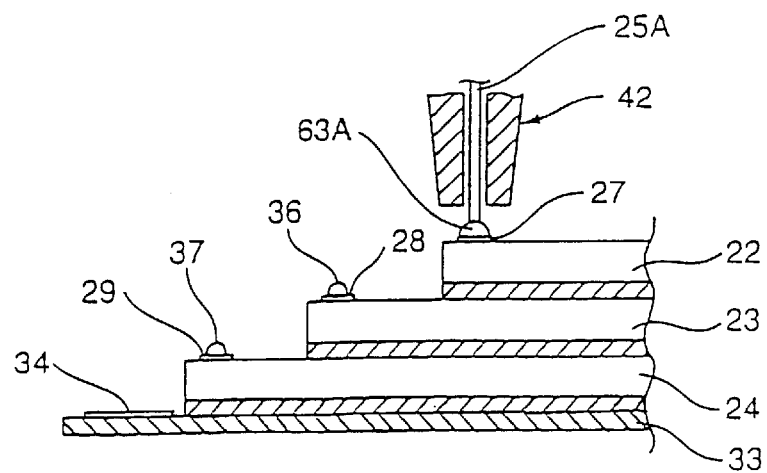
FIG. 9 is a diagram illustrating another bonding process in the method for producing the semiconductor device of FIG. 6.

FIG. 9 shows a state in which a fine metal line 25A is joined to the first electrode 27 provided on the first semiconductor element 22 (first bonding). The wires 30 through 32 are laid by using a capillary 42 which is provided in the wire bonding device.

The capillary 42 has a hole formed in the center thereof through which the fine metal line 25A can pass. The fine metal line 25A is coupled to the electrode 27 by using the capillary 42 such that part of the fine metal line 25A is extended out of the capillary 42 so as to form a ball portion on the extended part by a spark discharge or the like, and then the ball portion is pressed upon the electrode 27 while the capillary 42 is ultrasonically vibrated. Thus, the fine metal line 25A is ultrasonically welded on the electrode 27.

As previously described, during the first bonding of the fine metal line 25A, the ball portion formed on the end of the fine metal line 25A is joined to the electrode 27, and such a junction is called a nail head bonding. In a description to be given below, a junction portion between the fine metal line 25A and the electrode 27 is called a first nail head bonding (hereinafter referred to as NHB) portion 63A.

When the fine metal line 25A is joined to the first electrode 27, the capillary 42 pushes the fine metal line 25A out and moves it to a place where the second electrode 28 of the second semiconductor element 23 is formed. Then, the capillary 42 presses the fine metal line 25A upon the first stud bump 36 formed on the second electrode 28 so as to perform an ultrasonic welding by the ultrasonic vibration (second bonding).

Figure 10:
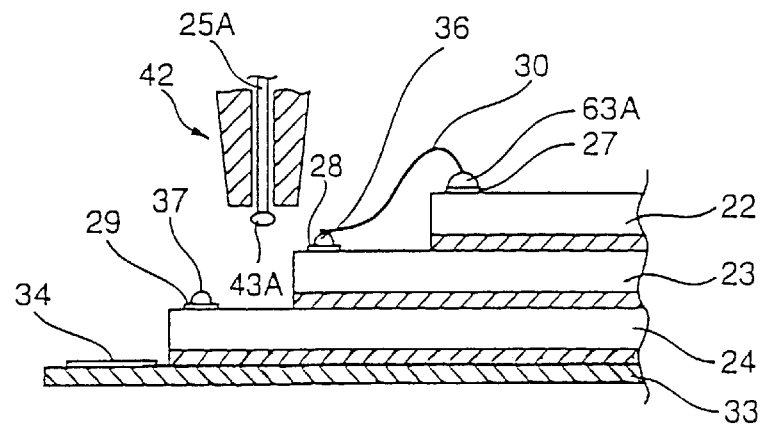
FIG. 10 is a diagram illustrating still another bonding process in the method for producing the semiconductor device of FIG. 6.

Thus, as shown in FIG. 10, one of the first wires 30 is laid between one of the first electrodes 27 and one of the second electrodes 28. At this time, although the first stud bump 36 is somewhat deformed due to being pressed by the capillary 42, a predetermined height D1 is maintained as shown by arrows in FIG. 13.

In this embodiment as previously described, a second bonding side of the first wire 30 is joined to the first stud bump 36. The first stud bump 36 is made of a material (conductive material) the same as that of wires 30 through 32.

For this reason, in a state of the second bonding side of the first wire 30 being joined to the stud bump 36, the first wire 30 becomes electrically connected with the second electrode 28. Also, FIG. 10 shows a state in which a ball portion 43A is formed on the end portion of the fine metal line 25A so as to form the second wire 31.

As previously described, when laying of the first wire 30 is completed, laying of the second wire 31 begins. The second wire 31 is laid such that the capillary 42 is moved to a place where the first stud bump 36 is formed, and then the ball portion 43A is pressed upon the first stud bump 36 and at the same time, the capillary 42 is ultrasonically vibrated.

Figure 11:
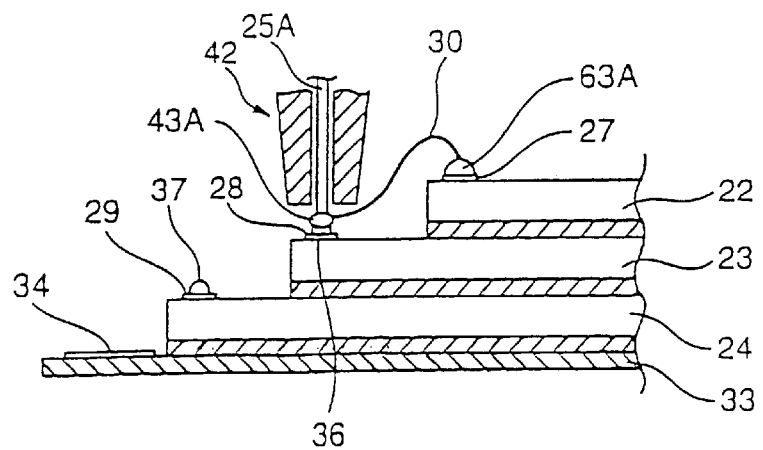
FIG. 11 is a diagram illustrating still another bonding process in the method for producing the semiconductor device of FIG. 6.

Thus, as shown in FIG. 11, the fine metal line 25A is ultrasonically welded on the first stud bump 36. Since the welding of the fine metal line 25A becomes the first bonding, a second NHB portion 64A is formed on the first stud bump 36.

After the fine metal line 25A is joined to the first stud bump 36, the capillary 42 pushes the fine metal line 25A out and moves it to a place where the third electrode 29 of the third semiconductor element 24 is formed. Next, the capillary 42 presses the fine metal line 25A upon the second stud bump 37 formed on the third electrode 29 so as to perform the ultrasonic vibration (the second bonding).

Figure 12:
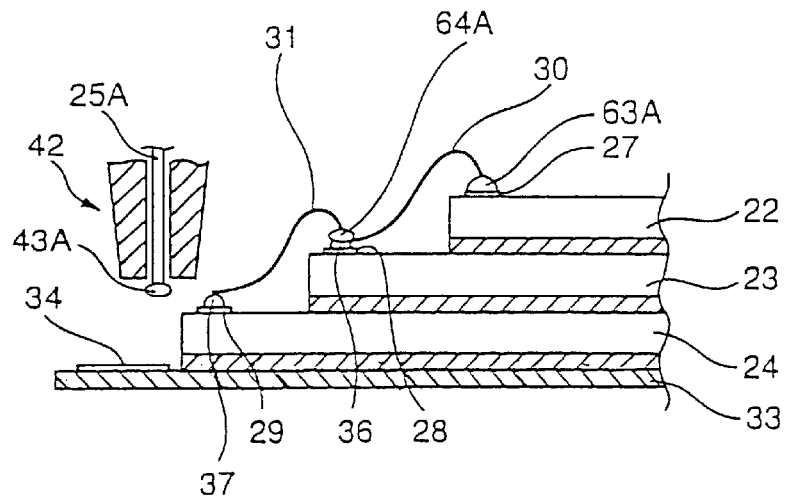
FIG. 12 is a diagram illustrating still another bonding process in the method for producing the semiconductor device of FIG. 6.

Thus, as shown in FIG. 12, the second wire 31 is laid between the second electrode 28 and the third electrode 29.

Figure 13:
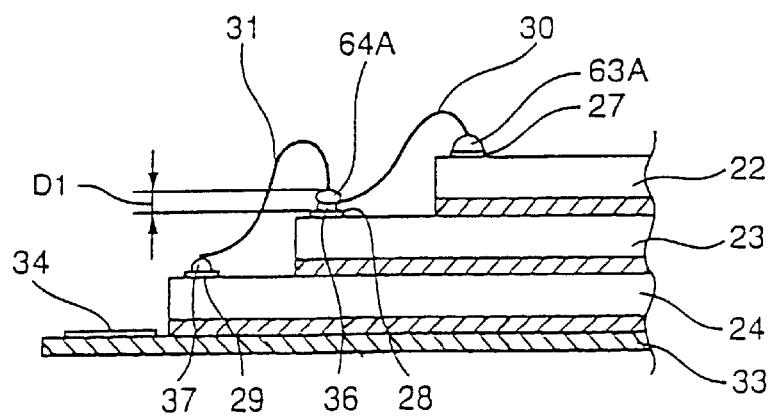
FIG. 13 is a diagram illustrating effects of the semiconductor device of FIG. 6.

At this time, although the second stud bump 37 is somewhat deformed due to being pressed by the capillary 42, the predetermined height D1 is maintained as shown by an arrow in FIG. 13. Further, since the second stud bump 37 is also made of the same conductive material, in a state of the second bonding side of the second wire 31 being joined to the stud bump 37, the second wire 31 becomes electrically connected with the third electrode 29.

Similarly, by performing the same process as previously described, the third wire 32 is laid between the third electrode 29 and the bonding pad 34 of the substrate 33. On the bonding pad 34, however, there is no stud bump formed.

By performing the wire bonding process previously described, the wires 30 through 32 can be connected to the substrate 33 via the relays of the semiconductor elements 24 and 23, and thereby they are laid step by step from the first semiconductor element 22 to the substrate 33. According to such a configuration, the wires 30 through 32 can be shortened and the loop heights thereof can be lowered.

When the wires 30 through 32 are shortened, inductance thereof is reduced and thereby the electrical characteristics (particularly high-frequency characteristics) of the semiconductor device 20A can be improved. In addition, for example, if the electrodes of all the semiconductor elements are directly connected to the bonding pads, it is possible to bring about problems that the bonding pads may be congested with the multiple wires, the adjacent wires may contact each other, and the bonding pads may need to be enlarged.

In contrast, according to this embodiment, the electrodes of the first and second semiconductor elements 22 and 23 are not directly connected to the bonding pads 34 and thereby the number of the wires is not increased even in a connection place near to the substrate 33. Hence, the adjacent wires can avoid contacting each other and the miniaturization of the bonding pads 34, which contributes to the miniaturization of the semiconductor device 20B, can be achieved.

Figure 14:
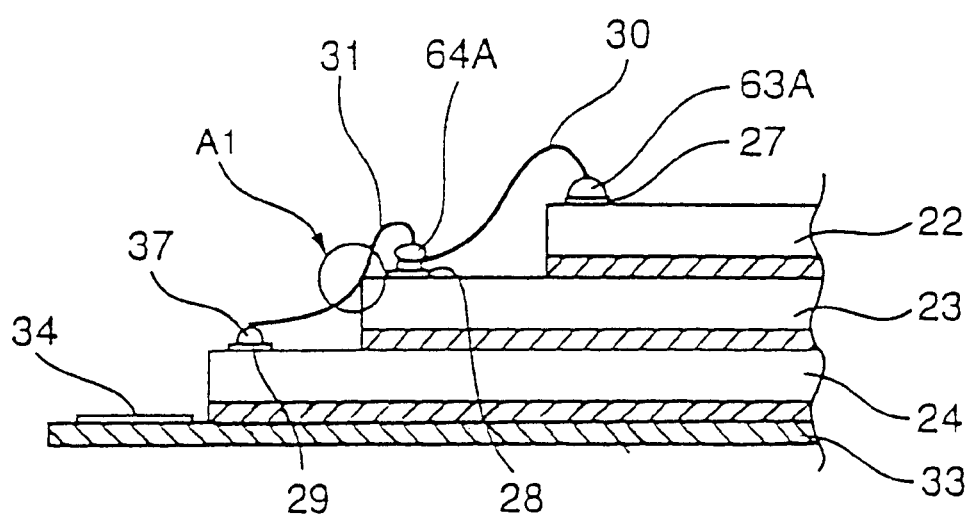
FIG. 14 is a diagram illustrating a problem generated when wires are directly bonded to electrodes of the semiconductor device of the second embodiment according to the present invention.

Further, by lowering the loop heights of the wires 30 through 32, the miniaturization (in height) of the semiconductor device 20A can be realized. In the case of lowering the loop heights of the wires 30 through 32, however, the wires 30 through 32 may contact the corner portions of the semiconductor elements 22 through 24 as shown by an arrow A1 in FIG. 14, and this may result in a short circuit.

In this embodiment, however, the first stud bump 36 is mounted between the second NHB portion 64A and the second electrode 28 and the second stud bump 37 is mounted between the third NHB portion 65A and the third electrode 29. Thereby, the wires 30 through 32 can avoid contacting the corner portions of the semiconductor elements 22 through 24.

Next, with reference to FIG. 13, a description is given below in respect to effects of the first and second stud bumps 36 and 37. Because the effects of the first stud bump 36 is the same as that of the second stud bump 37, the description is given only for the first stud bump 36.

The first stud bump 36 is sandwiched between the second electrode 28 and the second NHB portion 64A, where the second bonding of the first wire 30 is performed. As previously described, since the first stud bump 36 has the height D1, the second NHB portion 64A is separated from the second electrode 28 by the predetermined measure D1. That is, the first stud bump 36 serves as the spacer member for separating the second NHB portion 64A from the second electrode 28.

On the other hand, in order to avoid having the wires 30 through 32 contacting the semiconductor elements 22 through 24, it is necessary to form a space therebetween. As described in this embodiment, by providing the first stud bump 36 therebetween, the second bonding position of the first wire 30 is separated from the second electrode 28, and thereby the first wire 30 is separated from the corner of the first semiconductor element 22.

Also, by providing the first stud bump 36, the second NHB portion 64A is separated from the second electrode 28 and the second wire 31 is separated from the corner of the second semiconductor element 23. Further, in the second bonding position of the second wire 31, the second stud bump 37 is provided and thereby the second wire 31 is separated from the corner of the second semiconductor element 23.

Accordingly, by providing the first and second stud bumps 36 and 37, the contact of the wires 30 through 32 with the semiconductor elements 22 through 24 can be prevented. As a result, a short circuit does not occur between the wires 30 through 32 and circuits formed in the semiconductor elements 22 through 24, and thereby the reliability of the semiconductor device 20B can be improved.

Also, distances between the wires 30 through 32 and the semiconductor elements 22 through 24 can be adjusted by adjusting the heights of the first and second stud bumps 36 and 37. It is desirable to set these heights at least as high as required to provide space between the wires 30 through 32 and the semiconductor elements 22 through 24.

That is, it would be better for the stud bumps 36 and 37 to be made higher in terms of preventing the wires 30 through 32 from contacting the semiconductor elements 22 through 24. If the stud bumps 36 and 37 are made too high, however, the loop heights of the wires 30 through 32 become higher and this results in a larger size of the semiconductor device 20B.

Accordingly, by properly designing the heights of the stud bumps 36 and 37 equal to the minimum height required to form the space between the wires 30 through 32 and the semiconductor elements 22 through 24, the miniaturization and high reliability of the semiconductor device 20B can both be achieved.

Next, a description will be given below with respect to a third embodiment of the present invention.

Figure 15:
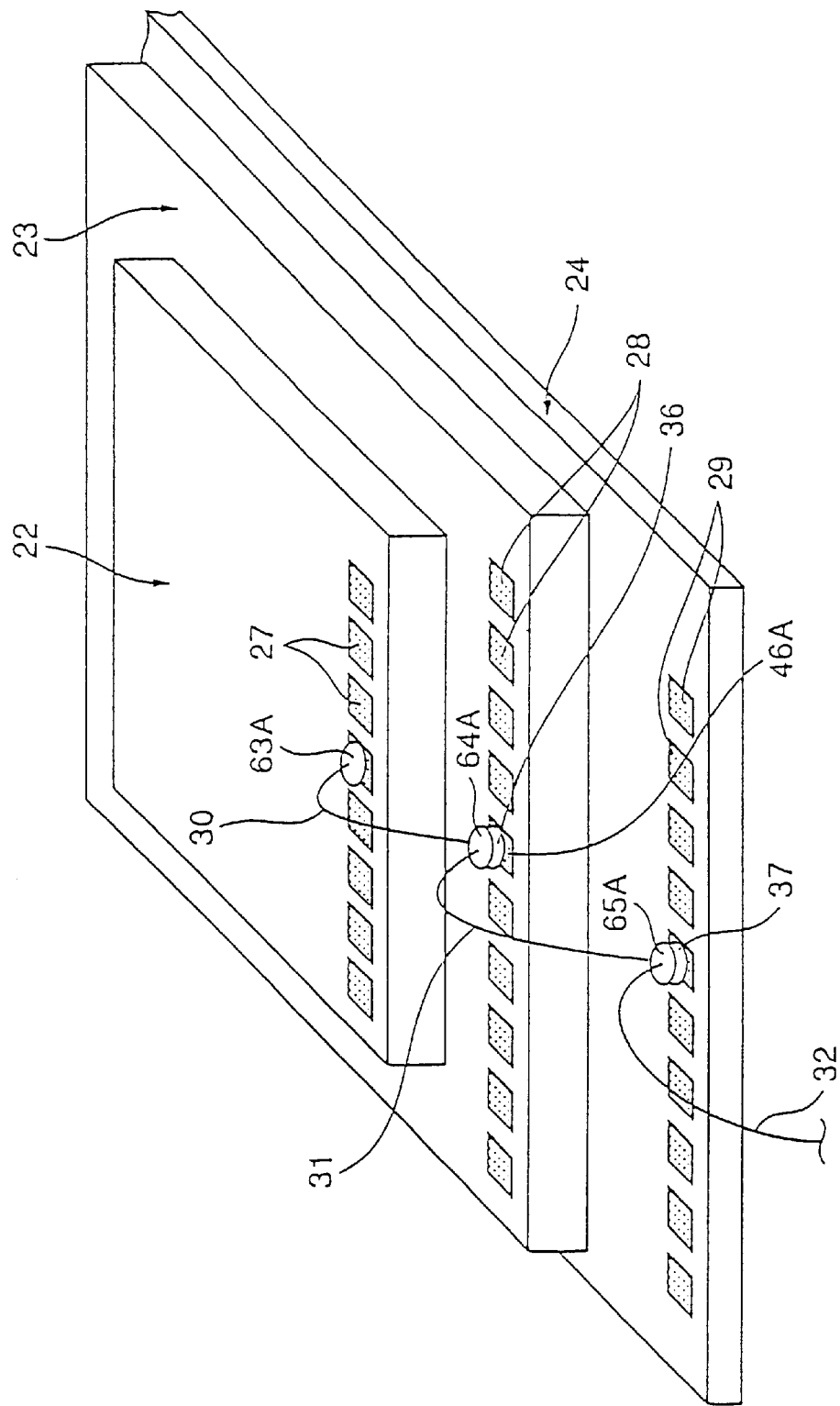
FIG. 15 is a diagram illustrating a wire connecting structure of a semiconductor device of a third embodiment according to the present invention.

FIG. 15 is a diagram illustrating a wire connecting structure of a semiconductor device of the third embodiment. In addition, in FIG. 15 and other diagrams to be used later, parts, which are the same as those in FIGS. 5 through 13 used for the first embodiment, are given the same reference numerals and a description thereof is omitted.

The semiconductor device of the second embodiment is featured in that dummy pads 46A which are provided on the semiconductor elements 22 through 24 serve as a relay portion for the wires 30 through 32. The dummy pads 46A are not electrically connected with circuits formed within the semiconductor elements 22 through 24.

Also, the dummy pads 46A, which are provided on places where the electrodes 27 through 29 are located, have sizes equal to or larger than the electrodes 27 through 29. The dummy pads 46A provide sufficient space for the wires to be connected thereto.

As previously described, since the dummy pad 46A is electrically not connected with circuits formed within the semiconductor element 23, the dummy pad 46A can be connected to the wires 30 and 31 without considering electrical properties. That is, in a case of connecting a pair of semiconductor elements (for example, the first and second semiconductor elements 22 and 23) by using the first wire 30, the electrodes 27 and 28 that are connected together are required to have identical electrical properties. However, the dummy pad 46A is not connected with the circuits of the semiconductor element 23 and therefore the properties of the dummy pad 46A need not be considered.

In this configuration, the dummy pads 46A provided on the semiconductor elements 22 through 24 can serve as relay portions for relaying the wires 30 through 32. That is, the dummy pads 46 provide latitude in laying out the wires 30 through 32 so that the wires 30 through 32 can be made shorter than otherwise, and can be laid without an undesirable wire flow at the time of the mold of the encapsulating resin 26.

In addition, in this embodiment, FIG. 15 only shows one dummy pad 46A provided on the second semiconductor element 23. Usually, each of the semiconductor elements 22 through 24 is provided with a plurality of the dummy pads 46A. Also, in a case where two of the dummy pads 46A are adjacent to each other, by connecting two adjacent dummy pads 46A, the freedom in forming the NHB portion 64A can be improved.

Next, a description will be given below with respect to a fourth embodiment of the present invention.

Figure 16:
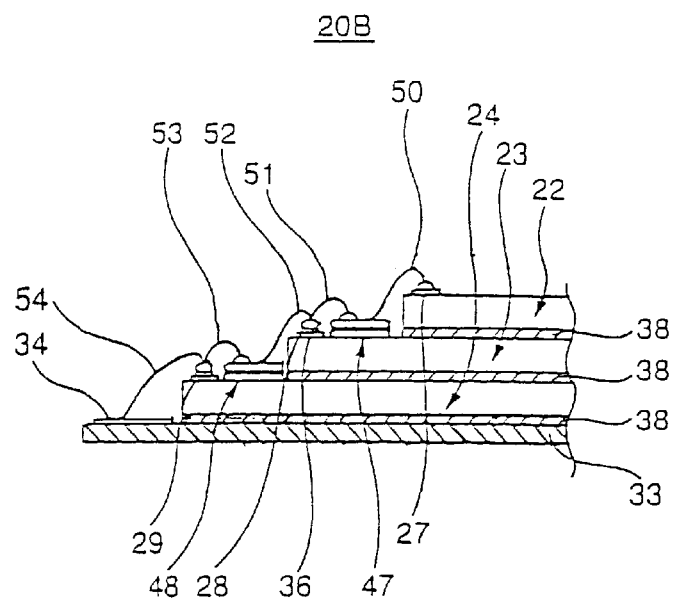
FIG. 16 is a front view illustrating a wire connecting structure of a semiconductor device of a fourth embodiment according to the present invention.
Figure 17:
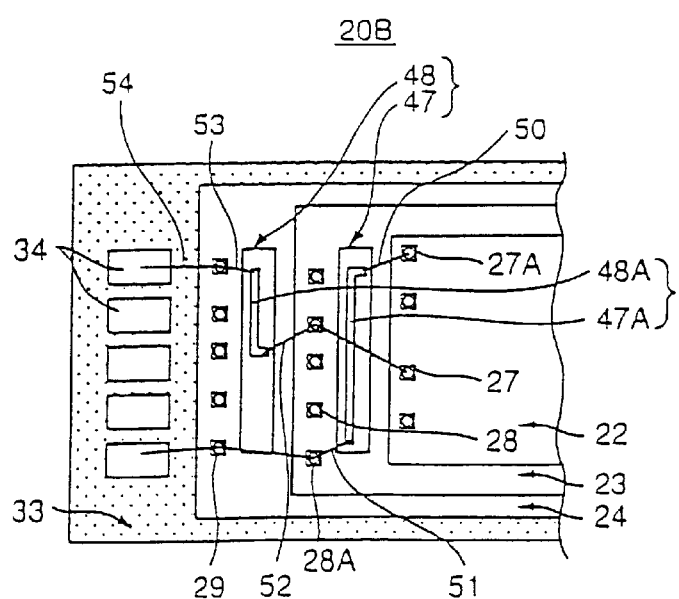
FIG. 17 is a plan view illustrating the wire connecting structure of the semiconductor device of the fourth embodiment according to the present invention.

FIGS. 16 and 17 show a wire connecting structure of the semiconductor device 20B of the fourth embodiment according to the present invention.

The semiconductor device 20B in this embodiment has a feature where re-wiring layers 47 and 48 are provided on the second and third semiconductor elements 23 and 24, respectively.

As seen from FIG. 17, the re-wiring layer 47 is provided approximately parallel to a row of the second electrodes 28 on a stepped portion formed by the first and second semiconductor elements 22 and 23. Also, the re-wiring layer 48 is provided approximately parallel to a row of the third electrodes 29 on a stepped portion formed by the second and third semiconductor elements 23 and 24.

In this embodiment, the re-wiring layers 47 and 48 are formed as printed circuit substrates where re-wiring patterns 47A and 48A having predetermined patterns are formed thereon. Also, the re-wiring layers 47 and 48 are fixed on the second and third semiconductor elements 23 and 24 with adhesive.

Besides being formed as the printed circuit substrate, the re-wiring layers 47 and 48 may be formed as flexible printed substrates or the like, and may be integrally formed on the second and third semiconductor elements 23 and 24.

Thus, by providing the re-wiring layers 47 and 48 on the second and third semiconductor elements 23 and 24, first through fifth wires 50 through 54 can be prevented from crossing and generating a short circuit even if the electrodes 27 through 29 provided on the semiconductor elements 22 through 24 are laid out in a different way. With respect to this, a description will be given below.

In a case of connecting the stacked semiconductor elements 22 through 24, the wires 50 through 54 need to be laid between the electrodes which have the equal electrical properties and signal properties, namely, equi-electrodes. In a case where an electrode layout of the directly stacked first semiconductor element 22 is equal to that of the second semiconductor element 23 and the electrode layout of the second semiconductor element 23 is equal to that of the third semiconductor element 24, the wires 50 through 54 may be laid between the electrodes 27 through 29, straight without crossing (see FIGS. 6 and 7).

However, in a case where the electrode layouts of the semiconductor elements are different from each other, the equi-electrodes 27 through 29 are not arranged in corresponding positions on the semiconductor elements, and the wires need to be laid between those equi-electrodes. For this reason, the laying of these wires becomes difficult. In particular, if the wires are laid with high density, they may contact each other, but avoiding the contact thereof may require increasing the size of the semiconductor device.

In contrast, in the third embodiment, by providing the re-wiring layers 47 and 48, which have the predetermined re-wiring patterns 47A and 48A, on the semiconductor elements 23 and 24, the wires 50 through 54 are, via the re-wiring layers 47 and 48, electrically connected among the first through third semiconductor elements 22 and 24 and between the third semiconductor element 24 and the substrate 33.

Specifically, as shown in FIG. 17, a first electrode 27A, which is the uppermost one on the semiconductor element 22, and a second electrode 28A, which is the lowermost one on the semiconductor element 23, are equi-electrodes and therefore need to be wire-connected. In a case of connecting the electrodes 27A and 28A directly via a wire, the wire has to be diagonally laid and may contact other wires provided thereon. Also, since the length of the diagonally laid wire is increased, the electrical properties thereof may be degraded.

Accordingly, in this embodiment, without directly connecting the first electrode 27A and the second electrode 28A, first, the first electrode 27A is connected to the re-wiring layer 47 via the first wire 50.

The re-wiring layer 47 has the re-wiring pattern 47A which is approximately parallel to the rows of electrodes 27 and 28. The first wire 50 is laid between an upper end of the re-wiring pattern 47A and the first electrode 27A and the second wire 51 is laid between a lower end of the re-wiring pattern 47A and the second electrode 28A.

Thus, the first and second wires 50 and 51 do not interfere with other wires and are laid with shortened lengths. In addition, other wires may form wire loops over the re-wiring layer 47.

By providing the re-wiring layers 47 and 48, the wires 50 through 54 are prevented from crossing and thereby generating a short circuit. Also, it is possible that combinations of the semiconductor elements 22 through 24 will not be restricted by the electrode layouts. Also, the wires are shortened and thereby the electrical properties of the semiconductor device 20B can be improved.

Next, a description will be given below with respect to a fifth embodiment of the present invention.

Figure 18:
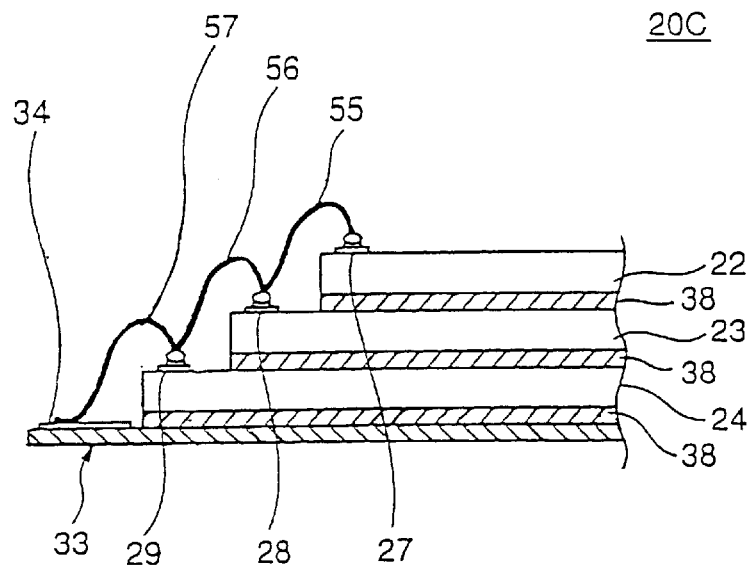
FIG. 18 is a front view illustrating a wire connecting structure of a semiconductor device of a fifth embodiment according to the present invention.

FIG. 18 is a wire connecting structure of the semiconductor device 20C of the fifth embodiment. The semiconductor device 20C has a feature in which first through third wires 55 through 57 are larger in diameter than the wires 30 through 32.

Specifically, the diameter of each of the wires 30 through 32, which are used in the previously described embodiments, is approximately 25 $\mu$m, but in this embodiment, the diameter of the wires 55 through 57 ranges between 50 $\mu$m and 150 $\mu$m. Accordingly, inductance of the wires 55 through 57 can be reduced and thereby high-frequency properties thereof can be improved.

Figure 19:
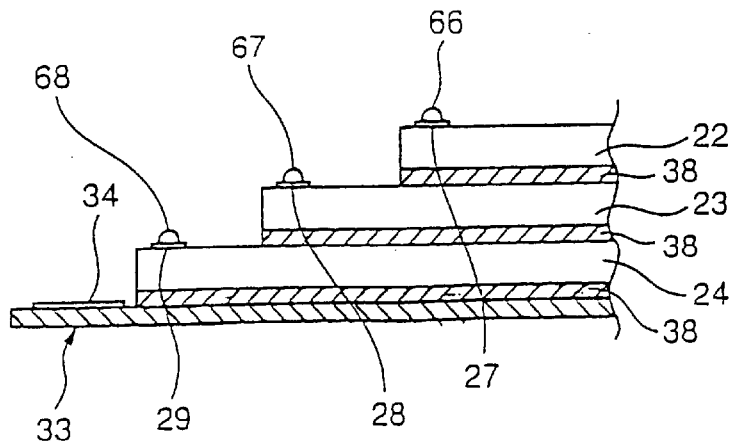
FIG. 19 is a diagram illustrating a bonding process used in the wire connecting structure of FIG. 18.
Figure 20:
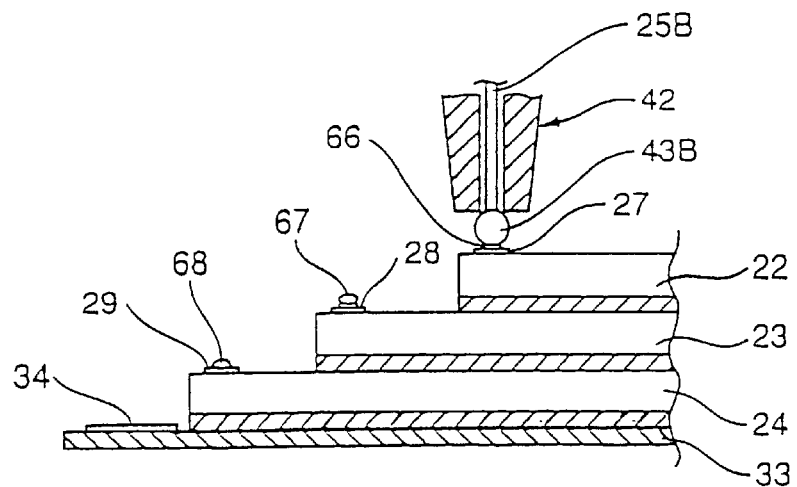
FIG. 20 is a diagram illustrating another bonding process used in the wire connecting structure of FIG. 18.

FIGS. 19 and 20 illustrates a wire bonding process for laying the first through third wires 55 through 57 as a part of a method for producing the semiconductor device 20C. Next, a description will be given below in respect of the wire bonding process. In addition, parts, which are the same as those in FIGS. 8 to 14, are given the same reference numerals.

FIG. 19 shows a state prior to the bonding of the first through third wires 55 through 57. In this embodiment, the stud-bump forming process is also performed before the wire bonding process.

The stud-bump forming process performed in this embodiment is featured in that first through third stud bumps 66 through 68 are formed correspondingly to all of the electrodes 27 through 29 provided on the first through third semiconductor elements 22 through 24. That is, in this embodiment, the stud bump 66 is formed corresponding to the electrode 27 of the first semiconductor element 22.

The first through third stud bumps 66 through 68, which serve as the spacer members the same as the previously described first and second stud bumps 36 and 37, are formed by the wire bonding device used in the wire bonding of the first through third wires 55 through 57. The fine metal line 25A, which has a diameter of 25 μm less than that of the wires 55 through 57, is also used in this embodiment for forming the stud bumps 66 through 68.

The wire bonding device can use either the fine metal line 25A with the diameter of 25 μm for forming the stud bumps 66 through 68 or the fine metal line 25B with a diameter ranging from 50 μm to 150 μm for forming the wires 55 through 57. Accordingly, both the first through third stud bumps 66 through 68 and the first through third wires 55 through 57 are formed by using only one device. As a result, no additional equipment is needed to form the stud bumps 66 through 68 in this embodiment and thereby the production cost of the semiconductor device 20C is not increased.

FIG. 20 shows a first bonding state of the fine metal line 25B being joined to the first electrode 27 of the first semiconductor element 22. In this embodiment, since the fine metal line 25B having the diameter of 50 μm to 150 μm is relatively thick, a ball portion 43B formed on an end thereof becomes relatively large.

The capillary 42 presses the ball portion 43B upon the first stud bump 66 previously formed on the electrode 27 and at the same time is ultrasonically vibrated, so that the ball portion 43B is ultrasonically welded on the first stud bump 66. Since the junction of the fine metal line 25B is the first bonding, a first NHB portion 63B is formed on the first stud bump 66. At this time, although the first stud bump 66 is somewhat deformed by the pressing of the capillary 42, a predetermined height D3 shown by an arrow in FIG. 24 is maintained.

After the fine metal line 25B is joined to the first electrode 27 via the first stud bump 66, the capillary drags the fine metal line 25B and moves it to a place where the second electrode 28 of the second semiconductor element 23 is formed. Then, the capillary 42 presses the fine metal line 25B upon the second stud bump 67 formed on the second electrode 28 and, at the same time performs an ultrasonic weld with the ultrasonic vibration (the second bonding).

Figure 21:
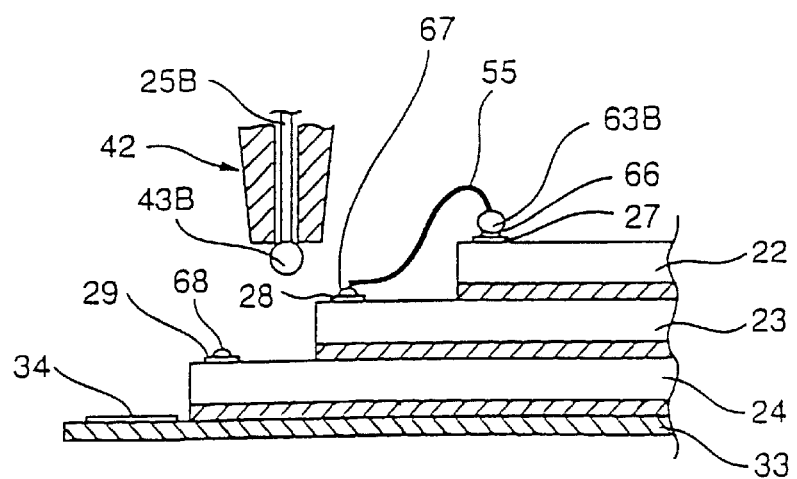
FIG. 21 is a diagram illustrating still another bonding process used in the wire connecting structure of FIG. 18.
Figure 24:
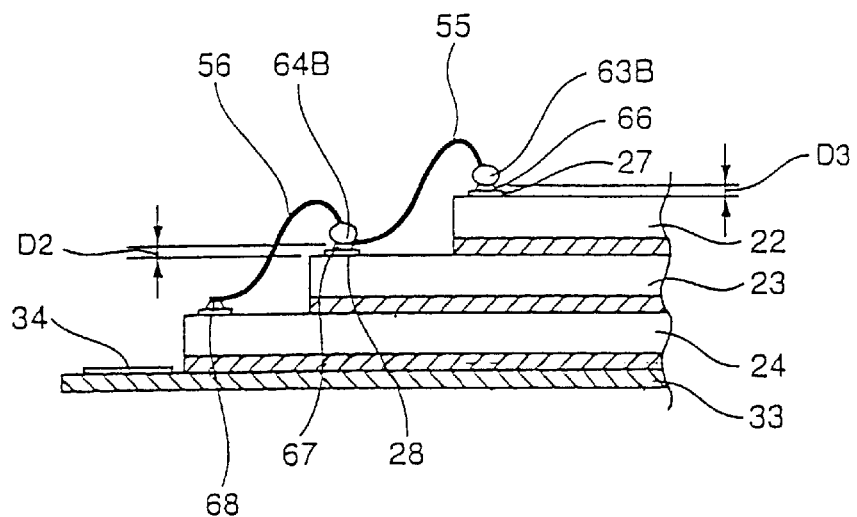
FIG. 24 is a diagram illustrating effects of the wire connecting structure of FIG. 18.

Thus, although the second stud bump 67 is somewhat deformed by the pressing of the capillary 42, a predetermined height D2 shown by an arrow in FIG. 24 is maintained. Accordingly, as shown in FIG. 21, the first wire 55 is laid between the first electrode 27 and the second electrode 28.

As previously described, after the first wire 55 is thus laid, the second wire 56 is laid such that the capillary 42 is moved to a place where the second stud bump 67 is formed so that the capillary 42 can press the ball portion 43B upon the second stud bump 67 and at the same time is ultrasonically vibrated.

Figure 22:
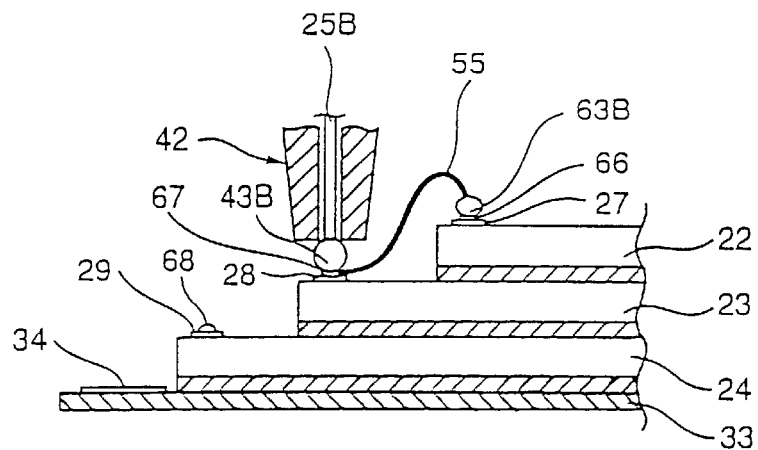
FIG. 22 is a diagram illustrating still another bonding process used in the wire connecting structure of FIG. 18.

As shown in FIG. 22, the fine metal line 25B is ultrasonically welded on the second stud bump 67. Since the junction of the fine metal line 25B thereto is the first bonding, a second NHB portion 64B is formed on the second stud bump 67.

After the fine metal line 25B is joined to the second stud bump 67, the capillary 42 pushes out the fine metal line 25B therefrom and moves it to a place where the third electrode 29 of the third semiconductor element 24 is formed. Then, the capillary 42 presses the fine metal line 25B upon the third stud bump 68 formed on the third electrode 29 so as to perform the ultrasonic weld (the second bonding).

Figure 23:
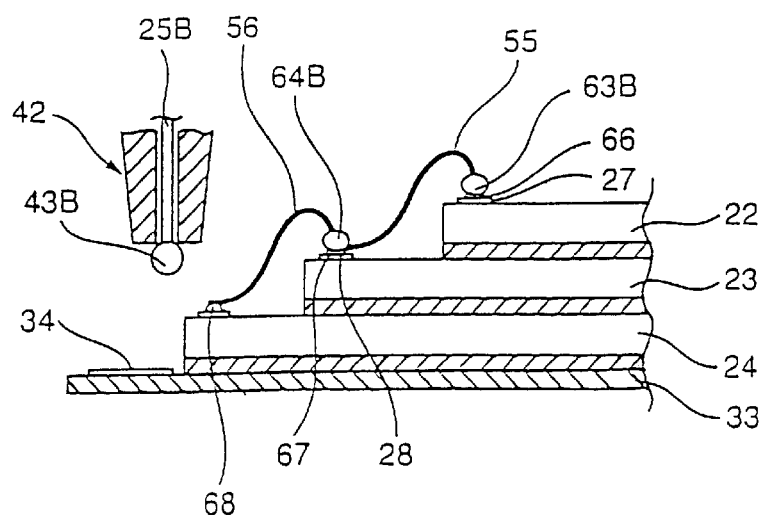
FIG. 23 is a diagram illustrating still another bonding process used in the wire connecting structure of FIG. 18.

Thus, although the second stud bump 67 is also somewhat deformed by the pressing of the capillary 42, the predetermined height D2 is maintained. Accordingly, as shown in FIG. 23, the second wire 56 is laid between the second electrode 28 and the third electrode 29. Similarly, by performing the previously described process, the third wire 57 is laid between the third electrode 29 and the bonding pad 34 of the substrate 33.

Accordingly, in the fifth embodiment, by providing the first through third stud bumps 66 through 68, the first through third wires 55 through 57 can be separated from the semiconductor elements 22 through 24. As a result, there is no short-circuit in the circuits formed by the wires 55 through 57 within the semiconductor elements 22 through 24 and the reliability of the semiconductor device 20C can be improved.

Figure 25:
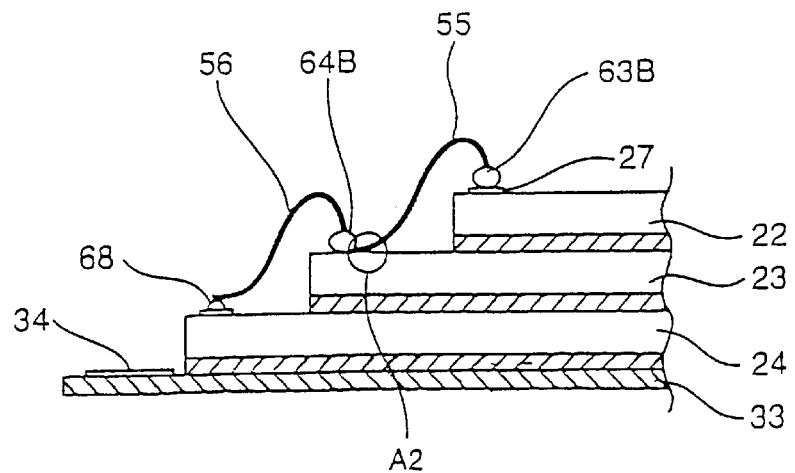
FIG. 25 is a diagram illustrating a problem generated when wires are directly bonded to electrodes of the semiconductor device of the fifth embodiment according to the present invention.

Also, as previously described, since the fine metal line 25B is thick, the NHB portions 63B, 64B and 65B formed during the first bonding of the fine metal line 25B become large. Accordingly, in a case where the stud bumps 66 through 68 are not provided, as shown by an arrow A2 in FIG. 25, the NHB portions 63B, 64B and 65B may spill out of the electrodes 27 through 29 and contact electrodes adjacent thereto or into the circuits formed in the semiconductor elements 22 through 24. FIG. 25 shows an example of the expansion of just the second NHB portion 64B.

However, in this embodiment, since the stud bumps having the predetermined heights are provided between the NHB portions 63B to 65B and the electrodes 27 through 29, the NHB portions 63B to 65B can be prevented from spilling out of the electrodes 27 through 29. In this embodiment, fine metal lines that are sufficiently thin are used for forming the stud bumps 66 through 68, ensuring that the metal does not spill out of the electrodes 27 through 29.

Also, even during a process of connecting the first wire 55 to the first electrode 27, it is possible for the first NHB portion 63B to stick out of the first electrode 27. For this reason, in this embodiment, the stud bump 66 is also formed on the first electrode 27.

The above description is provided in order to enable any person skilled in the art to make and use the invention and sets forth the best mode contemplated by the inventors for carrying out their invention.

Although the present invention has been described in terms of various embodiments, it is not intended that the invention be limited to these embodiments. Modification within the spirit of the invention will be apparent to those skilled in the art.

The present application is based on Japanese priority application No. 11-310150 filed on Oct. 29, 1999, the entire contents of which are hereby incorporated by reference.

What is claimed is:

1. A semiconductor device comprising:
   a substrate having a plurality of flip-chip pads formed on a first surface thereof and a plurality of wire bonding pads formed on a second surface thereof;

a first semiconductor element provided on said first surface of said substrate via the flip-chip pads in a face-down state;

a second semiconductor element provided on said second surface, opposite to said first surface, of said substrate in a face-up state and electrically connected to said wire bonding pads by wires; and an extended wiring mechanism formed on said substrate for connecting the flip-chip pads and the respective wire bonding pads to each other, the connected flip-chip pads and the wire bonding pads corresponding to equi-electrodes whose electrical characteristics are equal.

2. The semiconductor device as claimed in claim 1, further comprising a plurality of connecting terminals provided on said substrate, wherein said extended wiring mechanism includes:

a plurality of connecting terminals provided on said substrate;

a plurality of vias formed penetrating said substrate;

first extended wires laid on said first surface of said substrate and serving to electrically connect said first semiconductor element and said vias; and second extended wires laid on said second surface of said substrate and serving to electrically connecting said semiconductor element, said connecting terminals and said vias.

3. The semiconductor device as claimed in claim 1, wherein said substrate is a flexible wiring substrate made of polyimide as a basic material.

4. The semiconductor device as claimed in claim 1, wherein said substrate is a printed wiring substrate made of glass epoxy as a basic material.

5. The semiconductor device as claimed in 2, wherein said connecting terminals are solder balls, said solder balls being formed to be in electrical connection with said extended wiring mechanism.

6. The semiconductor device as claimed in claim 2, wherein said connecting terminals are solder balls, said solder balls being formed to be in electrical connection with said extended wiring mechanism.

7. The semiconductor device as claimed in claim 1, further comprising a semiconductor element or a plurality of semiconductor elements stacked on and electrically connected to said second semiconductor element.

8. The semiconductor device as claimed in claim 2, wherein said first and second extended wires are formed by print-wiring metal leaf into a predetermined pattern.

* * * * *